United States Patent
Kuo

(10) Patent No.: US 6,510,314 B1
(45) Date of Patent: Jan. 21, 2003

(54) MIXER CIRCUIT WITH OUTPUT STAGE FOR IMPLEMENTATION ON INTEGRATED CIRCUIT

(75) Inventor: Yao Hsien Kuo, W. Bloomfield, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 33 days.

(21) Appl. No.: 09/658,518

(22) Filed: Sep. 8, 2000

(51) Int. Cl.[7] ............................................. H04B 1/26
(52) U.S. Cl. ...................... 455/326; 455/313; 455/325; 455/333; 455/323; 455/327; 455/330
(58) Field of Search ................................ 455/313, 323, 455/333, 326, 314, 327; 327/113

(56) References Cited

U.S. PATENT DOCUMENTS

| | | | |
|---|---|---|---|
| 4,058,771 A | 11/1977 | Ohsawa et al. | ............. 325/446 |
| 4,268,916 A | 5/1981 | Kusakabe | |
| 4,313,221 A | 1/1982 | Mattfeld | ..................... 455/319 |
| 4,556,990 A | 12/1985 | Hasler | ..................... 455/333 |
| 4,677,692 A | 6/1987 | Sakashita et al. | ........... 455/319 |
| 4,979,233 A | 12/1990 | Kawahata | ................... 455/330 |
| 5,519,359 A * | 5/1996 | Driscoll | ........................ 331/39 |
| 5,768,700 A * | 6/1998 | Kardontchik | ............... 455/333 |
| 5,826,182 A | 10/1998 | Gilbert | ....................... 455/326 |
| 5,859,559 A | 1/1999 | Hong et al. | |
| 5,884,154 A | 3/1999 | Sano | ........................... 455/333 |
| 5,893,028 A | 4/1999 | Brehmer et al. | ............ 455/313 |
| 5,995,819 A * | 11/1999 | Yamaji et al. | .............. 455/326 |
| 6,044,255 A * | 3/2000 | Suematsu et al. | ........... 455/333 |
| 6,094,570 A * | 7/2000 | Consolazio | ................. 455/327 |
| 6,115,363 A * | 9/2000 | Oberhammer et al. | ...... 370/777 |
| 6,140,849 A * | 10/2000 | Trask | ......................... 327/113 |
| 6,229,395 B1 * | 5/2001 | Kay | .......................... 330/252 |

FOREIGN PATENT DOCUMENTS

| | | |
|---|---|---|
| EP | 01 12 1370 | 9/2002 |
| FR | 2 609 221 A1 | 7/1988 |
| WO | WO 96/25790 | 8/1996 |

* cited by examiner

*Primary Examiner*—Edward F. Urban
*Assistant Examiner*—Marceau Milord
(74) *Attorney, Agent, or Firm*—Quarles & Brady LLP; John E. Kajander

(57) ABSTRACT

An output stage of a double balanced mixer having a first intermediate port and a second intermediate port includes an operational amplifier, an impedance and first and second current source devices. The operational amplifier has a first input port, a second input port and an IF output port, and the impedance is coupled between the first input port and the second input port. The first current source device has a first terminal coupled to both the first input port and the first intermediate port, which are coupled to one another. The second current source device has a second terminal coupled to both the second input port and the second intermediate port, which are coupled to one another.

20 Claims, 1 Drawing Sheet

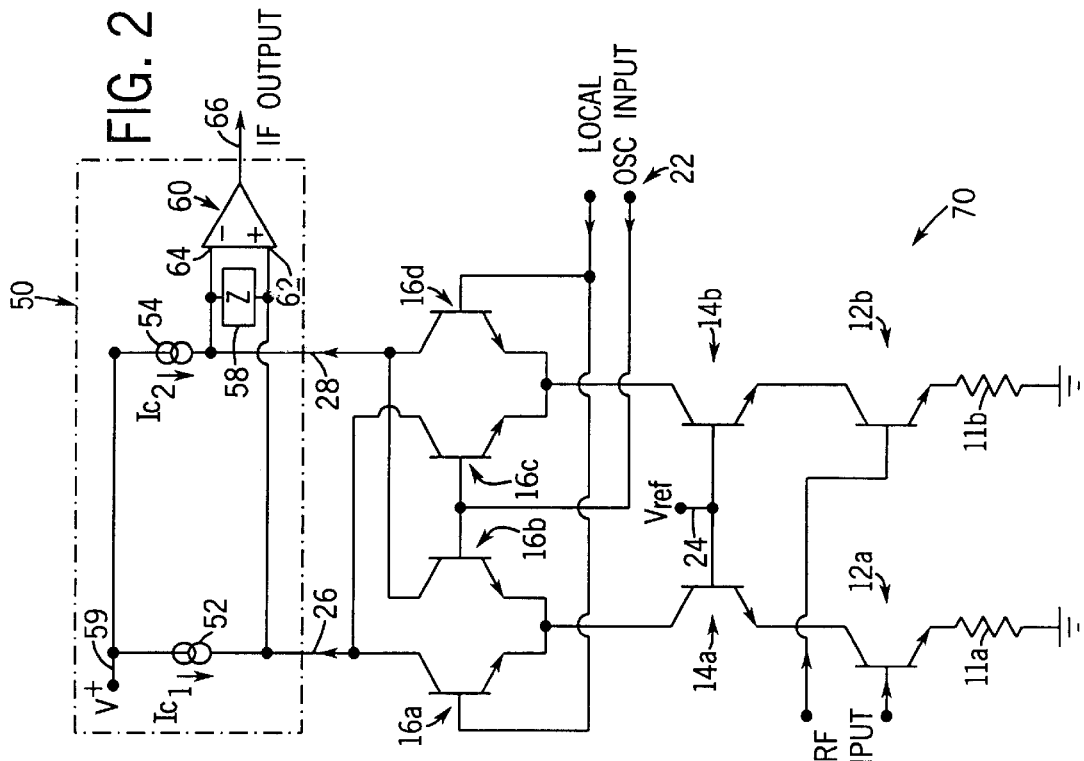
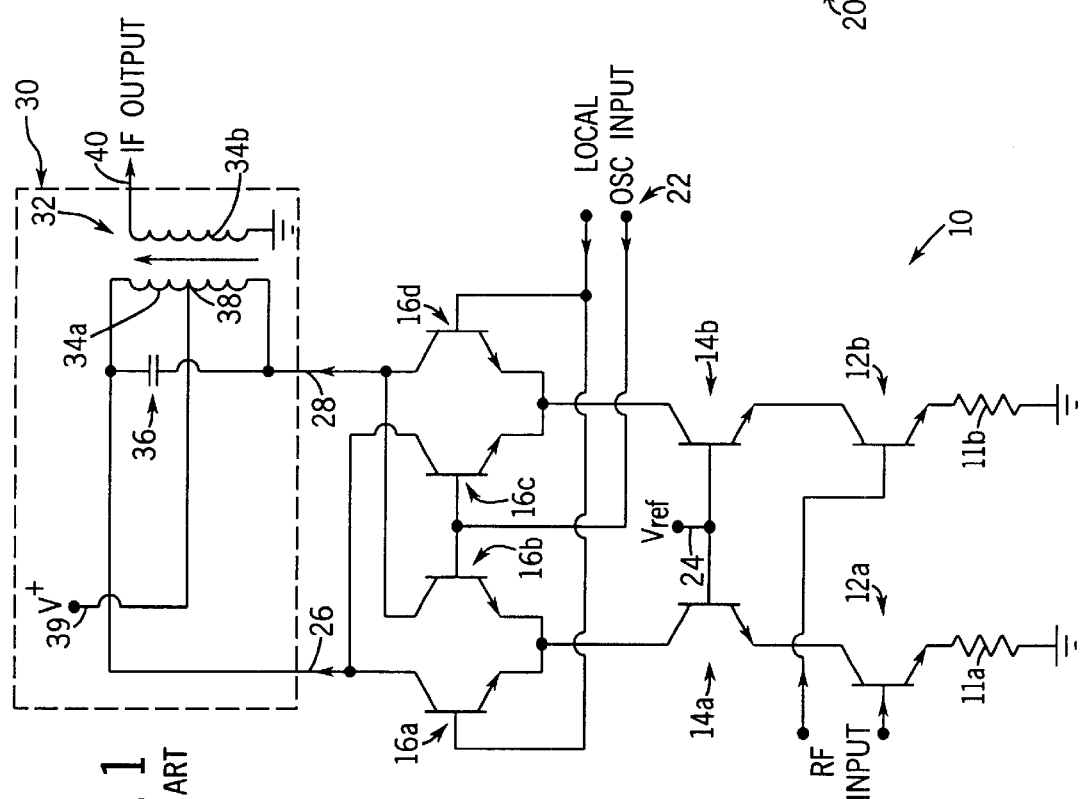

MIXER CIRCUIT WITH OUTPUT STAGE FOR IMPLEMENTATION ON INTEGRATED CIRCUIT

FIELD OF THE INVENTION

The present invention relates to wireless communications devices and, in particular, relates to mixer circuits on integrated circuits that are used to convert between radio frequency (RF) signals and intermediate frequency (IF) signals in the wireless communications devices.

BACKGROUND OF THE INVENTION

Wireless communications devices are ubiquitous in modern life. In recent times, there has been an explosion in the usage of cellular telephones and other types of remote communications devices, as well as increasing usage of wireless communications devices in other applications, including automotive applications. One of the reasons for the recent explosion in the use of wireless communications devices has been the significant improvements in integrated circuit technologies, which have allowed the electronics necessary for wireless communications devices to be significantly reduced in size and price. For example, cellular telephones have become practical in large part because the reduction in size of the electrical components has allowed manufacturers to design smaller, more convenient handsets. Further reduction in the size and cost of the electrical components of wireless communications devices remains an imperative for the manufacturers of the wireless communications devices. In particular, the replacement of circuit elements that are not implementable on an integrated circuit with circuit elements that can be implemented on an integrated circuit remains an important goal.

A key component of the typical wireless communications device is the mixer circuit, which allows for frequency conversion between the radio frequency (RF) or even microwave signals received by the wireless communications device, which travel through the atmosphere, and intermediate frequency (IF) signals which are processed by the wireless communications device. The process of converting RF signals into IF signals is critical for isolating the information carried on a desired RF signal from all of the other information received by the wireless device which is carried on other RF signals. A conventional mixer circuit converts a RF signal into an IF signal by multiplying the RF signal by a local oscillator (LO) signal provided by a LO circuit. Because several signals including the desired IF signal are typically produced by this multiplication process, the mixer circuit typically includes one or more filters that filter out all signals other than the desired IF signal so that solely the desired IF signal is output by the mixer.

One common embodiment of a mixer circuit that is employed within many wireless communications devices is a double balanced mixer. Referring to FIG. 1 (Prior Art), a double balanced mixer 10 includes a RF input port 20, a LO input port 22, and a supply voltage port ($V_{ref}$) 24. The RF input port 20 receives two RF signals from an antenna (not shown), while the LO input port 22 receives two LO signals provided by a LO circuit (not shown) that is within the wireless communications device. The two RF signals are inverted (i.e., 180 degrees out of phase) with respect to one another, as are the two LO signals. Typically, baluns (not shown) are employed to convert the single RF and LO signals that are respectively provided by the antenna and LO circuit into, respectively, the pair of RF signals that are inverted with respect to one another and the pair of LO signals that are inverted with respect to one another. The double balanced mixer 10 effectively multiplies the RF and LO signals provided at the RF and LO input ports 20, 22, respectively, to produce first and second intermediate signals at a pair of intermediate ports 26, 28, respectively. The intermediate signals at intermediate ports 26, 28 include IF components that are inverted with respect to one another such that, when the IF component of the first intermediate signal at intermediate port 26 is high, the IF component of the second intermediate signal at intermediate port 28 is low, and vice-versa. The operation of the double balanced mixer 10 is discussed further below with respect to FIG. 2.

The double balanced mixer 10 further includes (or is coupled to, depending upon how the mixer circuit is defined) an output stage 30, which processes the two intermediate signals at the intermediate ports 26, 28 to derive an IF output signal that is output at an IF output port 40. As shown in FIG. 1, it is known for the output stage 30 to include a transformer 32 having a first coil 34a and a second coil 34b, and to further include a capacitor 36 that is coupled in parallel with the first coil. The parallel combination of the first coil 34a and the capacitor 36 is connected between the two intermediate ports 26, 28, while the second coil 34b is coupled between ground and the IF output port 40. A tap 38 connected to the middle of the first coil 34a is coupled to an additional supply voltage port ($V^+$) 39. The output stage 30 operates to combine or add the IF components of the first and second intermediate signals at intermediate ports 26, 28. Thus, the IF output signal provided at IF output port 40 has approximately double the amplitude of the IF components of the first and second intermediate signals at intermediate ports 26, 28 (assuming that the transformer 32 has an approximately 1:1 conversion ratio between coils 34a and 34b). For example, when the IF components of the first intermediate signal at intermediate port 26 is at its lowest value, the IF component of the second intermediate signal at intermediate port 28 is at its highest value such that the IF output signal at IF output port 40 is double the peak value of each of the IF components of the first and second intermediate signals.

In addition to deriving the IF output signal at IF output port 40 from the first and second intermediate signals at intermediate ports 26, 28, the output stage 30 has several additional purposes. First, the output stage 30 supplies DC power to each of the intermediate ports 26, 28 of the mixer 10 from supply voltage port 39 through tap 38 and first coil 34a. The DC power is necessary to properly bias the mixer 10 for its operation and to determine the mixer's gain. Second, the output stage 30 provides desired AC impedance between the first and second intermediate ports 26, 28 and the IF output port 40. The AC impedance separates the desired IF signal component produced by the mixing operation of mixer 10 from the other signal components produced by the mixing operation, by filtering out those other signal components. Third, the transformer 32 of the output stage 30 buffers the IF output port 40 from the remainder of the mixer 10.

Although the conventional output stage 30 shown in FIG. 1 effectively filters the first and second intermediate signals and generates the IF output signal, and additionally provides the desired DC power to the mixer 10 and the desired buffering, the design of the conventional output stage is not conducive for implementation on an integrated circuit. In particular, the transformer 32 with its two coils 34a, 34b cannot be implemented effectively on an integrated circuit. Consequently, the conventional mixer 10 can only be partially incorporated on an integrated circuit insofar as at least part of the output stage 30 must be constructed from discrete circuit elements that are connected to the integrated circuit. Thus, the size and price of the conventional mixer 10 are greater than would might otherwise be the case if the entire output stage 30 was implementable on an integrated circuit.

Given that, as discussed above, it is generally desirable to reduce the size of the electronic circuitry of wireless communications devices and further desirable, in particular, to implement as much of the electronic circuitry on integrated circuits as possible, it would be desirable if a new double-balanced mixer could be designed that was completely implementable on an integrated circuit (or at least more nearly completely implementable than the conventional mixer 10). It would particularly be desirable if the new double-balanced mixer employed a new output stage which was constructed from components which were completely implementable on an integrated circuit (or more nearly completely implementable than the conventional output stage 30). It would further be desirable if the new output stage, despite its new design, was nonetheless capable of performing all of the key functions performed by the conventional output stage of the conventional mixer as described above.

SUMMARY OF THE INVENTION

The present inventors have recognized that the conventional output stage of a conventional double balanced mixer circuit can be replaced with a new output stage that includes an operational amplifier, an impedance element, and a pair of currents source devices, and is fully implementable on an integrated circuit. The new output stage filters undesired signal components from the first and second intermediate signals of the double-balanced mixer by way of the impedance element, and combines the IF components of the intermediate signals to obtain the IF output signal. Further, the pair of current source devices provide the required DC biasing of the remainder of the mixer circuit, and the operational amplifier provides the desired buffering of the IF output port from the remainder of the mixer circuit.

In particular, the present invention relates to an output stage of a double balanced mixer having a first intermediate port and a second intermediate port. The output stage includes an operational amplifier having a first input port, a second input port and an IF output port, and an impedance coupled between the first input port and the second input port. The output stage additionally includes a first current source device having a first terminal coupled to both the first input port and the first intermediate port, which are coupled to one another, and a second current source device having a second terminal coupled to both the second input port and the second intermediate port, which are coupled to one another.

The present invention further relates to a double balanced mixer that includes first and second transistors that respectively receive first and second RF input signals that are inverted with respect to one another, and third and fourth transistors that are both coupled to the first transistor and respectively receive first and second LO input signals that are inverted with respect to one another. The double balanced mixer further includes fifth and sixth transistors that are both coupled to the second transistor and respectively receive the second and first LO input signals, where the third and fifth transistors are further coupled to one another and to a first intermediate port, and where the fourth and sixth transistors are further coupled to one another and to a second intermediate port. The double balanced mixer additionally includes an output stage including an operational amplifier, an impedance coupled between a first input terminal and a second input terminal of the operational amplifier, a first current source device coupled to the first intermediate port and to the first input terminal of the operational amplifier, which are coupled to one another, and a second current source device coupled to the second intermediate port and to the second input terminal of the operational amplifier, which are coupled to one another. The operational amplifier outputs an IF signal related to a frequency difference between the RF input signals and the LO input signals.

The present invention additionally relates to a double balanced mixer that includes a means for mixing RF input signals with LO input signals to produce two intermediate signals with IF components that are inverted with respect to one another. The double balanced mixer further includes a means for converting the two intermediate signals into a single IF output signal to be provided at an output terminal, for biasing the means for mixing, for filtering out undesirable signal components from the two intermediate signals, and for buffering the output terminal from at least one element.

The present invention further relates to a method of converting an RF signal into an IF signal. The method includes providing a double balanced mixer including an output stage, where the output stage includes an operational amplifier, an impedance, and first and second current source devices, and where the first and second current source devices are coupled respectively to first and second input ports of the operational amplifier and to first and second intermediate parts of the double balanced mixer. The first and second input ports of the operational amplifier are also respectively coupled to the first and second intermediate ports. The method additionally includes providing the RF signal and an LO signal to the double balanced mixer, and mixing the RF signal and the LO signal to obtain two intermediate signals at the first and second intermediate ports, where the intermediate signals include IF components that are inverted with respect to one another. The method further includes filtering signal components that are not within a desired IF frequency range from the two intermediate signals, and providing the IF signal at an IF output port of the operational amplifier in response to the two intermediate signals, where the IF output port is buffered from the first and second intermediate ports by the operational amplifier.

BRIEF DESCRIPTION OF THE DRAWINGS

FIG. 1 is a schematic diagram of a prior art mixer that can be employed within a wireless communications device, where the mixer includes a prior art output stage; and FIG. 2 is a schematic diagram of a new double balanced mixer having a new output stage in accordance with one embodiment of the present invention.

DETAILED DESCRIPTION OF THE INVENTION

Referring to FIG. 2, a new double balanced mixer 70 that can be entirely implemented on an integrated circuit is shown. The new double balanced mixer 70 is the same as the conventional mixer 10 shown in FIG. 1 except insofar as it includes a new output stage 50, which replaces the conventional output stage 30, and which is discussed further below. As shown, the mixer 70 continues to include RF input port 20, LO input port 22, and supply voltage port ($V_{ref}$) 24, as well as first intermediate port 26 and second intermediate port 28. Internally, mixer 70 further includes a first pair of NPN bipolar junction transistors 12a, 12b, the bases of which form RF input port 20. Specifically, transistor 12a receives a first RF input signal and transistor 12b receives a second RF input signal, where the two RF input signals are inverted with respect to one another. The emitters of transistors 12a, 12b are respectively coupled to ground by way of a pair of matched resistors 11a, 11b, while the collectors of the transistors are respectively coupled to the emitters of a second pair of NPN bipolar junction transistors 14a, 14b. The bases of the second pair of transistors 14a, 14b are tied together and form the supply voltage port 24.

Mixer 70 further includes four additional NPN bipolar junction transistors 16a–16d, the bases of which form the LO input port 22. The four transistors 16a–16d are arranged into two pairs, with the emitters of transistors 16a and 16b being coupled together and the emitters of transistors 16c and 16d being coupled together. The emitters of transistors 16a and 16b are further coupled to the collector of transistor 14a, while the emitters of transistors 16c and 16d are further coupled to the collector of transistor 14b. The bases of transistors 16a and 16d receive a first LO signal at the LO input port 22, while the bases of transistors 16b and 16c receive a second LO signal at the LO input port, where the first and second LO signals are inverted with respect to one another. The collectors of transistors 16a–16d are cross-coupled such that the collectors of transistors 16a and 16c are coupled to one another and to the first intermediate port 26, while the collectors of transistors 16b and 16d are coupled to one another and to the second intermediate port 28. As shown, mixer 70 employs only NPN bipolar junction transistors although, in alternate embodiments, other types of transistor devices can be employed instead such as PNP bipolar junction transistors, MOSFETs, etc. Transistors 12–16 need not all be the same type of transistor. While the mixer 70 is shown as a modified Gilbert-type mixer, the present invention can be employed in conjunction with other types of double balanced mixer circuits as well.

Mixer 70 operates to mix or multiply the RF signals at RF input port 20 and the LO signals at LO input port 22 to produce the first and second intermediate signals at first and second intermediate ports 26, 28. The RF signals and LO signals are multiplied because the transistors 16a–16d are turned on and off as the LO signals applied to the bases of those transistors vary with time. As the transistors 16a–16d are turned on and off, the currents flowing through the collectors of transistors 16a–16d approximate the product of the RF signals and square waves having the frequency of the LO input signals. In the frequency domain, these resulting currents include a variety of frequency components, including components of the desired IF frequency. The frequency components that are produced other than the desired IF frequency component must be filtered out for proper operation of the mixer 70. The first and second intermediate signals generated by the mixer 70 at intermediate ports 26 and 28 are the voltages at the collectors of transistors 16a, 16c and the collectors of transistors 16b, 16d, respectively. The first and second intermediate signals are inverted with respect to one another since the RF signals applied to the bases of transistors 12a and 12b are inverted with respect to one another.

As shown in FIG. 2, according to the present invention, the mixer 70 includes a new output stage 50. The new output stage 50 differs fundamentally from the conventional output stage 30 in that it does not employ transformer 32, and preferably employs components that can be entirely implemented on an integrated circuit. In particular, output stage 50 includes an operational amplifier 60, which has a first input terminal 62, a second input terminal 64 and an IF output port 66, as well as an impedance 58 coupled between the first and second input terminals. The output stage 50 further includes a first current source device 52 and a second current source device 54. The first current source device 52 is coupled between a supply voltage port (V$^+$) 59 and both the first input terminal 62 and the first intermediate port 26 of the mixer 70. The second current source device 54 is coupled between the supply voltage port 59 and both the second input terminal 64 and the second intermediate port 28 of the mixer 70. The first and second current sources devices 52, 54 respectively drive current from the supply voltage port 59 to the first and second intermediate ports 26, 28 of the mixer 70, although in alternate embodiments (e.g., embodiments which employ PNP transistors within the mixer) current can be driven away from the intermediate ports (e.g., towards ground).

The new output stage 50 performs all of the necessary functions that are performed by the conventional output stage 30 identified above. To begin, the output stage 50 combines the IF components of the two intermediate signals provided at the first and second intermediate ports 26, 28 into a single IF output signal at the IF output port 66. For example, when the IF component of the first intermediate signal at the first intermediate port 26 is at its peak, the IF component of the second intermediate signal at the second intermediate port 28 is at its valley (since the two IF signal components are inverted with respect to one another), and consequently the operational amplifier 60 outputs its peak positive current at the IF output port 66. Inversely, when the IF component of the first intermediate signal is at its valley, the IF component of the second intermediate signal is at its peak and the operational amplifier 60 outputs its peak negative current at the IF output port 66. Thus, the current output by the operational amplifier 60 at the IF output port 66 varies at the same frequency as the IF components of the intermediate signals at intermediate ports 26, 28, and so the output stage 50 produces a single IF output signal from the two intermediate signals.

Additionally, the new output stage 50 buffers the intermediate signals at intermediate ports 26, 28 from the IF output port 66 by way of the operational amplifier 60, and filters out undesired signal components from the intermediate signals, namely, signal components other than the IF signal components. The filtering occurs due to the operation of the impedance 58. In one embodiment, the impedance 58 is an inductor coupled in parallel with a capacitor (not shown) forming a conventional LC resonator which is tuned to the IF frequency (e.g., 10.7 MHz), preferably having a high Q. With such an LC resonator used as the impedance 58, the impedance appears to be an open circuit for the IF components of the intermediate signals. At the same time, signal components at frequencies other than the IF frequency are dissipated by the impedance. Although in one embodiment the impedance 58 is a LC resonator, in other embodiments the impedance includes other elements. For example, a variety of other types of conventional filter circuits (e.g., high-pass filter circuits including one or more resistors and capacitors) can be substituted for the LC resonator. The particular design of the impedance 58 will depend upon the frequency of the desired IF signal relative to the other intermediate signal components that are output at intermediate ports 26, 28. For example, if the frequency of the desired IF signal is lower than the frequencies of all of the other significant signal components that are produced, the impedance 58 can be a high-pass filter.

Further, the current source devices 52, 54 of the output stage 50 supply power to the rest of the mixer 70. Specifically, the current source devices 52, 54 drive DC currents into the intermediate ports 26, 28 and therefore into the collectors of transistors 16a–16d. Because the currents driven by the current source devices 52, 54 are equal to one another, both sides of the double balanced mixer 70 are properly DC biased. In addition to properly biasing the mixer 70, the current source devices 52, 54 also produce the proper AC impedance for developing the desired gain at the transistors 16a–16d. Each of the current source devices 52, 54 can be designed in a conventional manner, e.g., from a transistor biased using a pair of resistors (not shown).

As discussed above, the new output stage 50 of the mixer 70 is capable of performing all of the necessary functions that are performed by the conventional output stage 30. However, the new output stage 50 is advantageous relative to the conventional output stage 30 insofar as it does not include the transformer 32 and consequently can in many embodiments be implemented entirely on an integrated circuit. Although certain embodiments of the output stage 50 include a single discrete inductor as part of the impedance 58 (e.g., in some of the embodiments where the impedance is a LC resonator as discussed above), such embodiments still require less space than the conventional output stage 30 with transformer 32. Because of the space and cost savings inherent in implementing circuitry on an integrated circuit, the new mixer 70 with new output stage 50 is smaller and less expensive than conventional mixer 10 with conventional output stage 30.

It will occur to those that practice the art that many modifications may be made without departing from the spirit and scope of the invention. For example, the new output stage 50 can be employed with other types of double balanced mixer circuits than that shown in FIG. 2. Further the structure of the output stage 50 itself can be modified to suit other types of double balanced mixer circuits, e.g., by employing current source devices that drive current in the opposite direction to that shown, and to provide other desired impedance characteristics. In order to apprize the public of the various embodiments that may fall within the scope of the invention, the following claims are made:

What is claimed is:

1. An output stage of a double balanced mixer having a first intermediate port and a second intermediate port at which intermediate signals having IF components are provided, the output stage comprising:

an operational amplifier having a first input port, a second input port and an IF output port;

an impedance coupled between the first input port and the second input port;

a first current source device having a first terminal coupled to both the first input port and the first intermediate port, which are coupled to one another; and a second current source device having a second terminal coupled to both the second input port and the second intermediate port, which are coupled to one another.

2. The output stage of claim 1, wherein each of the first current source device and the second current source device includes at least one of a bipolar junction transistor and a MOSFET.

3. The output stage of claim 1, wherein the impedance has an effect of filtering out undesirable signal components existing at the first and second intermediate ports such that only an IF signal is provided at the IF output port.

4. The output stage of claim 1, wherein the operational amplifier provides a buffer between the IF output port and the first and second intermediate ports.

5. The output stage of claim 1, wherein the first current source device has a third terminal and the second current source device has a fourth terminal, and wherein the third and fourth terminals are both coupled to a supply voltage.

6. The output stage of claim 5, wherein the first and second current source devices drive current from the supply voltage into the first and second intermediate ports, respectively.

7. The output stage of claim 6, wherein the first and second current source devices act to DC bias the double balanced mixer.

8. The output stage of claim 1, wherein the impedance is an inductor in parallel with a capacitor.

9. A double balanced mixer comprising:

first and second transistors that respectively receive first and second RF input signals that are inverted with respect to one another;

third and fourth transistors that are both coupled to the first transistor and respectively receive first and second LO input signals that are inverted with respect to one another;

fifth and sixth transistors that are both coupled to the second transistor and respectively receive the second and first LO input signals, wherein the third and fifth transistors are further coupled to one another and to a first intermediate port, wherein the fourth and sixth transistors are further coupled to one another and to a second intermediate port, and wherein intermediate signals having IF components related to a frequency difference between the RF input signals and the LO input signals are provided at the first and second intermediate ports; and an output stage including an operational amplifier, an impedance coupled between a first input terminal and a second input terminal of the operational amplifier, a first current source device coupled to the first intermediate port and to the first input terminal of the operational amplifier, which are coupled to one another, and a second current source device coupled to the second intermediate port and to the second input terminal of the operational amplifier, which are coupled to one another, wherein the operational amplifier outputs an IF signal related to the IF components.

10. The double balanced mixer of claim 9, further comprising a seventh transistor that is coupled between the first transistor and third and fourth transistors, and an eighth transistor that is coupled between the second transistor and the fifth and sixth transistors, the seventh transistor and the eighth transistor being further coupled to one another and to a biasing voltage.

11. The double balanced mixer of claim 9, wherein the first, second, third, fourth, fifth, and sixth transistors operate to multiply the RF input signals and the LO input signals such that first and second intermediate IF signals are produced at the first intermediate port and the second intermediate port, respectively, the first and second intermediate IF signals being inverted with respect to one another.

12. The double balanced mixer of claim 11, wherein the impedance filters out signal components existing at the first and second intermediate ports other than the first and second intermediate IF signals, such that the operational amplifier solely outputs the IF signal.

13. The double balanced mixer of claim 11, wherein the first and second current source devices are further coupled to a supply voltage, and the first and second current source devices drive current into the first and second intermediate ports, respectively, to bias the double balanced mixer.

14. The double balanced mixer of claim 11, wherein the operational amplifier operates to buffer an IF output terminal of the operational amplifier that outputs the IF signal from a remainder of the double balanced mixer.

15. The double balanced mixer of claim 9, wherein the first and second LO input signals have a frequency of 10.7 MHz.

16. The double balanced mixer of claim 9, wherein each of the first, second, third, fourth, fifth and sixth transistors is at least one of a bipolar junction transistor and a MOSFET, and the double balanced mixer is entirely implementable on a single integrated circuit.

17. A double balanced mixer comprising:
   a means for mixing RF input signals with LO input signals to produce two intermediate signals with IF components that are inverted with respect to one another; and
   a means for converting the two intermediate signals into a single IF output signal to be provided at an output terminal, for biasing the means for mixing, for filtering out undesirable signal components from the two intermediate signals, and for buffering the output terminal from at least one element.

18. A method of converting an RF signal into an IF signal, the method comprising:
   providing a double balanced mixer including an output stage, wherein the output stage includes an operational amplifier, an impedance, and first and second current source devices, wherein the first and second current source devices are coupled respectively to first and second input ports of the operational amplifier and to first and second intermediate ports of the double balanced mixer, and wherein the first and second input ports are respectively coupled to the first and second intermediate ports;
   providing the RF signal and an LO signal to the double balanced mixer;
   mixing the RF signal and the LO signal to obtain two intermediate signals at the first and second intermediate ports, wherein the intermediate signals include IF components that are inverted with respect to one another;
   filtering signal components that are not within a desired IF frequency range from the two intermediate signals; and
   providing the IF signal at an IF output port of the operational amplifier in response to the two intermediate signals, wherein the IF output port is buffered from the first and second intermediate ports by the operational amplifier.

19. The method of claim 18, wherein the double balanced mixer is biased by the first and second current source devices, which are coupled between the first and second intermediate ports and a supply voltage.

20. The method of claim 18, wherein the first and second current source devices include bipolar junction transistors, and the double balanced mixer is provided on an integrated circuit.

* * * * *

UNITED STATES PATENT AND TRADEMARK OFFICE
CERTIFICATE OF CORRECTION

PATENT NO.      : 6,510,314 B1
DATED           : January 21, 2003
INVENTOR(S)     : Yao Hsien Kuo It is certified that error appears in the above-identified patent and that said Letters Patent is hereby corrected as shown below:

<u>Column 4,</u>
Line 32, "parts" should be -- ports --.

Signed and Sealed this

Fifteenth Day of April, 2003

JAMES E. ROGAN
*Director of the United States Patent and Trademark Office*